United States Patent [19]

Jamison

[11] Patent Number: 5,012,926
[45] Date of Patent: May 7, 1991

[54] ELECTRICALLY CONDUCTIVE CONTAINER

[75] Inventor: David S. Jamison, Roanoke Rapids, N.C.

[73] Assignee: W. R. Grace & Co.-Conn., Duncan, S.C.

[21] Appl. No.: 560,716

[22] Filed: Jul. 31, 1990

Related U.S. Application Data

[63] Continuation of Ser. No. 36,041, Apr. 8, 1987, abandoned.

[51] Int. Cl.⁵ .............................................. B65D 85/00
[52] U.S. Cl. ..................................................... 206/334
[58] Field of Search ................. 206/5.1, 334; 190/111; 220/337, 339

[56] References Cited

U.S. PATENT DOCUMENTS

| | | | |
|---|---|---|---|
| 2,185,032 | 12/1939 | Marsh | 220/20 X |
| 3,127,225 | 3/1964 | Oehrlein | 220/339 X |
| 3,741,377 | 6/1973 | Krellen | 206/5.1 X |
| 4,084,865 | 4/1978 | Joyce | 220/22 X |
| 4,494,651 | 1/1985 | Malcolm | 206/334 X |
| 4,658,422 | 4/1987 | Sparks | 220/22 X |

FOREIGN PATENT DOCUMENTS 840997  5/1939  France ............................. 190/111

OTHER PUBLICATIONS

Applegate et al., Technical Digest, No. 64, Oct. 1981, Western Electric.

*Primary Examiner*—William I. Price
*Attorney, Agent, or Firm*—John J. Toney; William D. Lee, Jr.; Mark B. Quatt

[57] ABSTRACT

A blow molded container comprises a base; a first cover in communication with the base, when the first cover is in a closed position, to form a first compartment; and a second cover, in communication with the base, when the second cover is in a closed position, to form a second compartment.

1 Claim, 5 Drawing Sheets

ELECTRICALLY CONDUCTIVE CONTAINER

This is a continuation application of application Ser. No. 036,041, filed on Apr. 8, 1987, now abandoned.

The present invention relates to portable containers for transporting and storing an electrically sensitive device. In particular, the field of the present invention includes containers which protectively shield their contents from potentially harmful external electrical forces.

BACKGROUND OF THE INVENTION

Portable containers are currently utilized to store and transport electrically sensitive devices such as computer panels to on-site field locations. One such example is the container described in U.S. Pat. No. 4,494,651 issued to Malcolm.

These containers are particularly useful in protecting the electrostatic discharge (ESD) sensitive devices from electrostatic charge build up which can adversely affect or destroy the utility of the ESD sensitive device.

Along with the development of such containers, telecommunications and data transmission technology has advanced to the point where a computer panel can be designed to facilitate the flow of data derived from metering instruments, across telephone lines to a central receiving station. For example, a panel can be designed which will allow the input of data from a water meter, as well as a link up to a telephone line, so that metering devices such as water meters can be read remotely by this dual hookup system.

A computer panel and system designed for this purpose would be installed for example on a floor joist or other relatively inaccessible part of a residence, commercial building, etc. One portion of the panel would be connected to the metering device such as a water meter, and another portion of the panel would be connected to a telephone line for remote communication with a central receiving area.

This system is clearly advantageous in eliminating the expensive and time consuming task of manual or other means of on-site meter reading.

However, a significant problem is the protection of the computer hardware during normal operation and periodic inspection and maintenance of the system. Since ESD sensitive devices are so susceptible to damage from the environment, it is important that such materials be adequately protected. However, at the same time it is required that the computer panel for example be physically connected to the metering device and telephone lines at the sight of installation.

The present invention solves this problem by providing a conductive container which beneficially provides adequate physical and electrostatic protection for the computer panel, while permitting access to a portion of the overall container in order to permit appropriate installation and connection of the device to metering equipment, telephone lines and the like.

SUMMARY OF THE INVENTION

In one aspect of the present invention, a blow molded container comprises a base; a first cover in communication with the base, when the first cover is in a closed position, to form a first compartment; and a second cover, in communication with the base, when the second cover is in a closed position, to form a second compartment.

DESCRIPTION OF THE PREFERRED EMBODIMENTS

Figure 1:
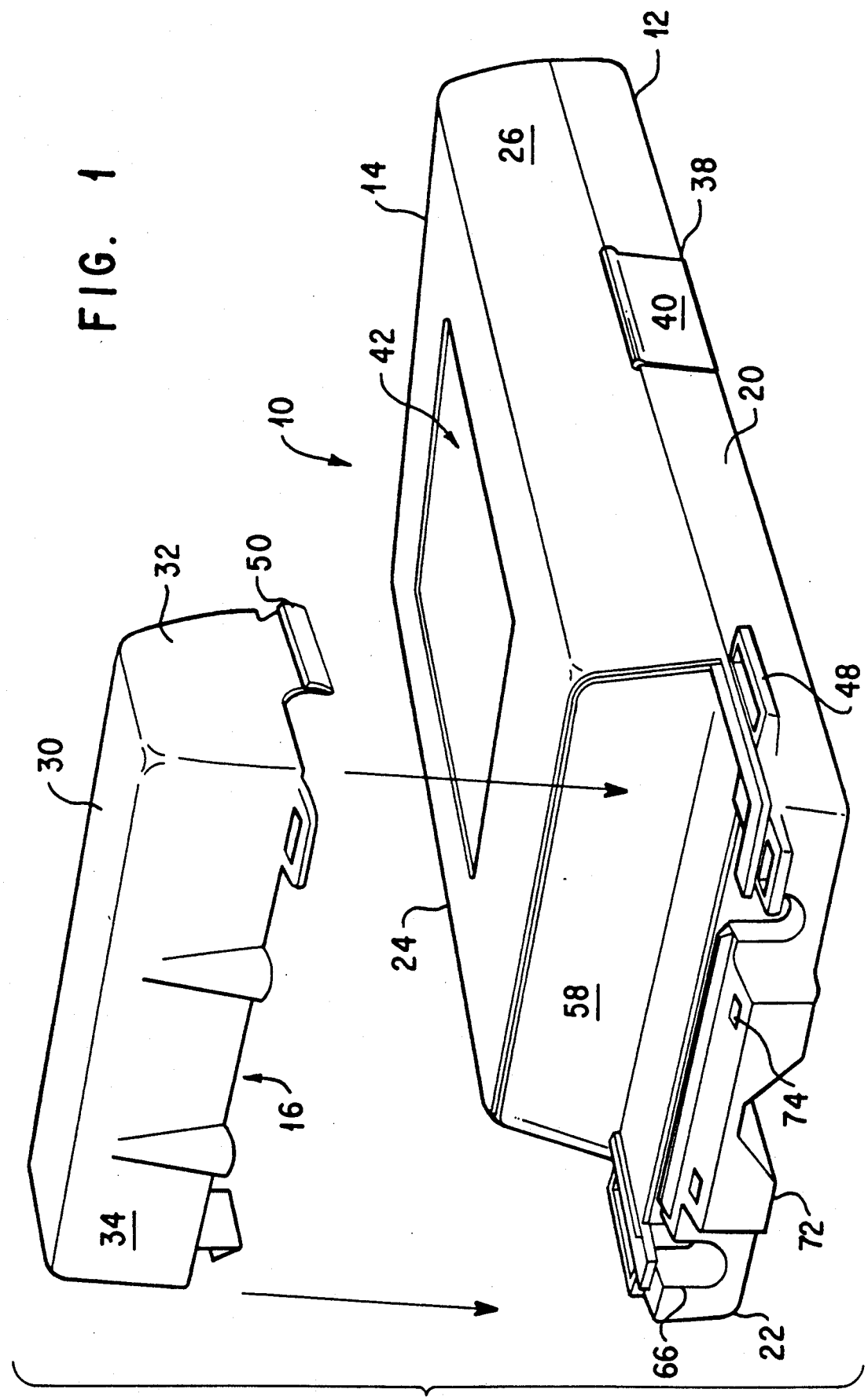
FIG. 1 is an isometric view of a preferred embodiment of a conductive container in accordance with the present invention.

Throughout the drawings like reference numerals represent like structure or means. FIG. 1 is an isometric view of a preferred embodiment of a conductive container for transporting and/or storing ESD sensitive devices at an on-site field location without subjecting the device contained therein to the potentially harmful effects of external electrical forces. The container 10 comprises a base 12, first cover 14, and second cover 16.

Figure 2:
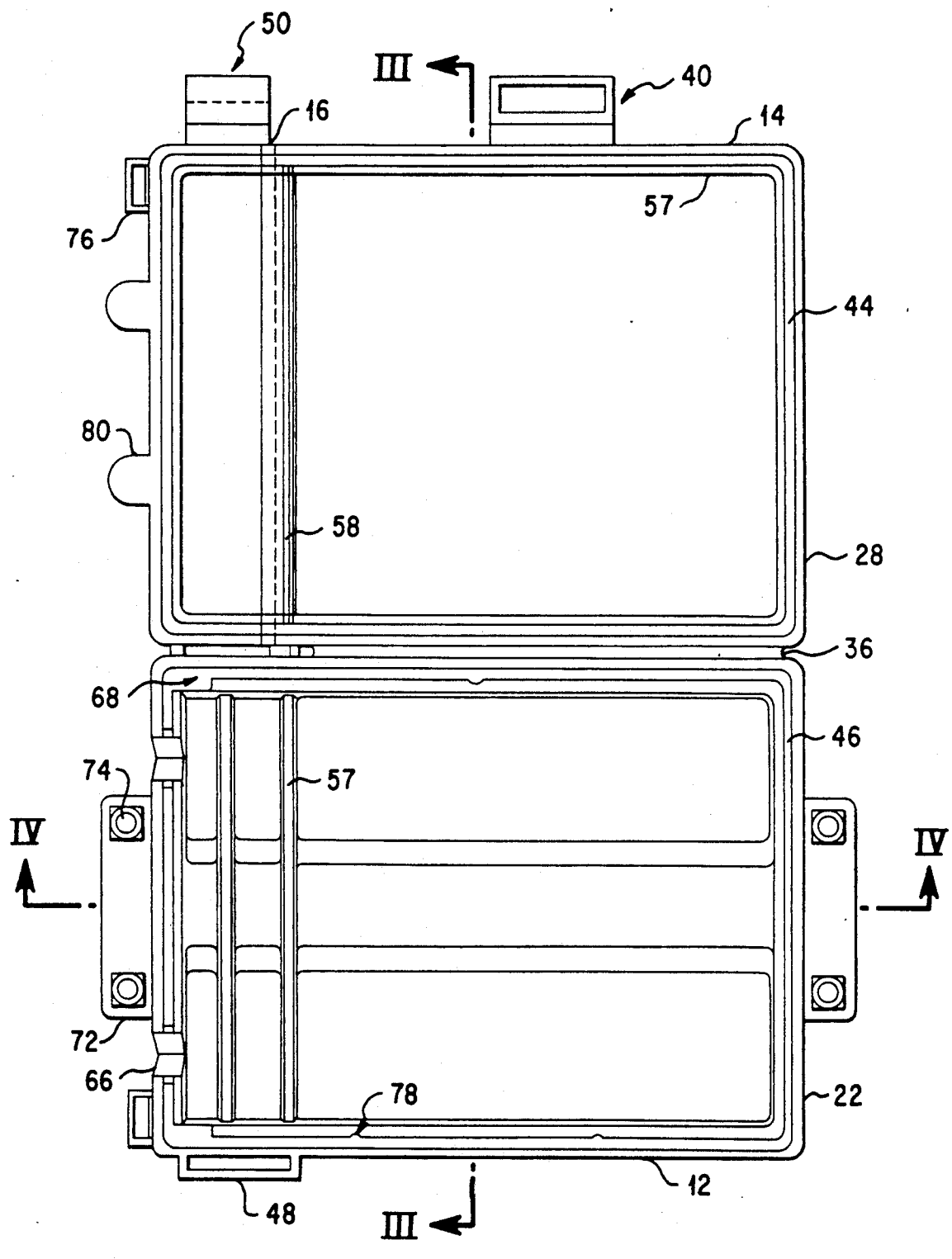
FIG. 2 is a plan view of the container of FIG. 1 in an open position disclosing the interior of the container.

The base 12 comprises a bottom 18 (FIG. 3), side walls 20 and end walls 22 (FIGS. 1 and 2). The base 12 is preferably of double wall construction. Thus, an air buffer zone 19 (FIG. 4) provides protection against physical shock and abuse for the stored computer panel or other ESD sensitive device.

Figure 4:
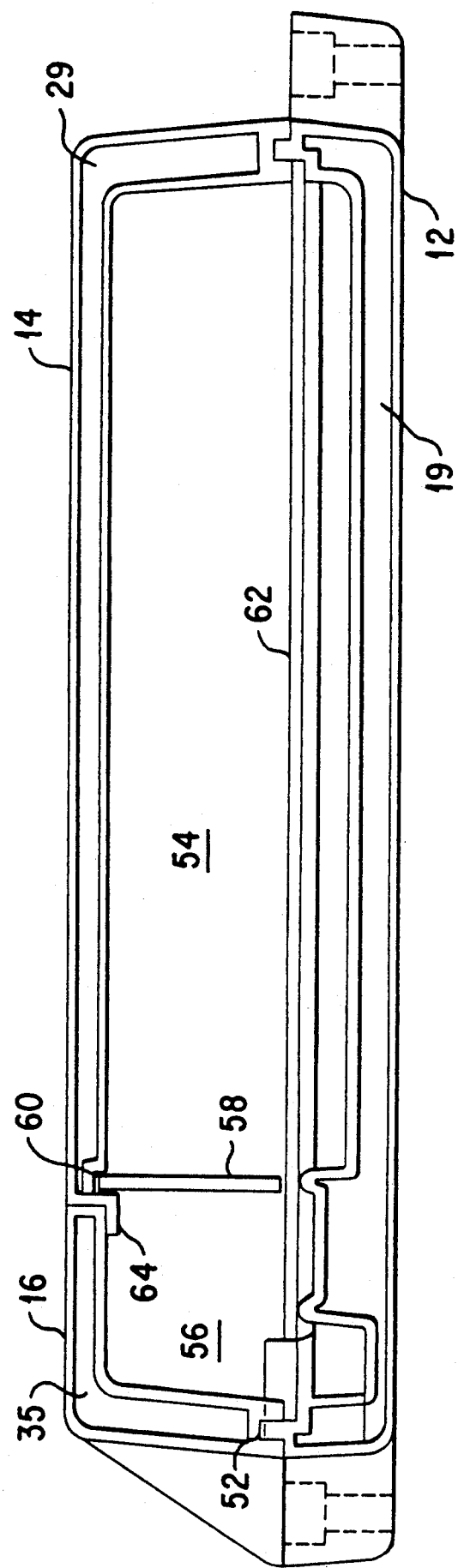
FIG. 4 is an expanded cross-sectional view of the container taken along line IV—IV of FIG. 2.

First cover 14 includes a top 24, side walls 26, and an end wall 28 (FIG. 2). First cover 14 is likewise preferably of double wall construction, including an air buffer zone 29 (FIG. 4).

The second cover 16 includes a top 30, side walls 32, and an end wall 34. The second cover is also preferably of double wall construction, having air buffer zone 35 (FIG. 4).

The first and second covers may be attached to base 12 by a variety of means. In one embodiment, an integral hinge 36 (FIG. 2) connects the first cover 14 to base 12 along respective side walls of the first cover and base. When such a hinge is used, preferably an integral latch 40 is integrally connected to the opposite side wall of first cover 14, and permits closure of the first cover onto the base 12 by means of integral latch bosses 38, best shown for example in FIG. 5.

The second cover 16 is preferably equipped with a pair of locking latches 50 at the extremity of the side walls 32. These locking latches engage in locking latch bosses 48 integrally formed in base 12.

Alternatively, the second cover 16 may be equipped with an integral hinge and an integral latch, and a corresponding integral latch boss may be utilized in base 12. Similarly, in an alternate embodiment, the first cover 14 may be equipped with a locking latch system with corresponding locking latch bosses in the appropriate position on the base 12. The advantages in using one latching system or another will be described in more detail below.

First cover 14 may be equipped with a recessed central area 42 to accommodate for example labels and other identifying materials.

Figure 3:
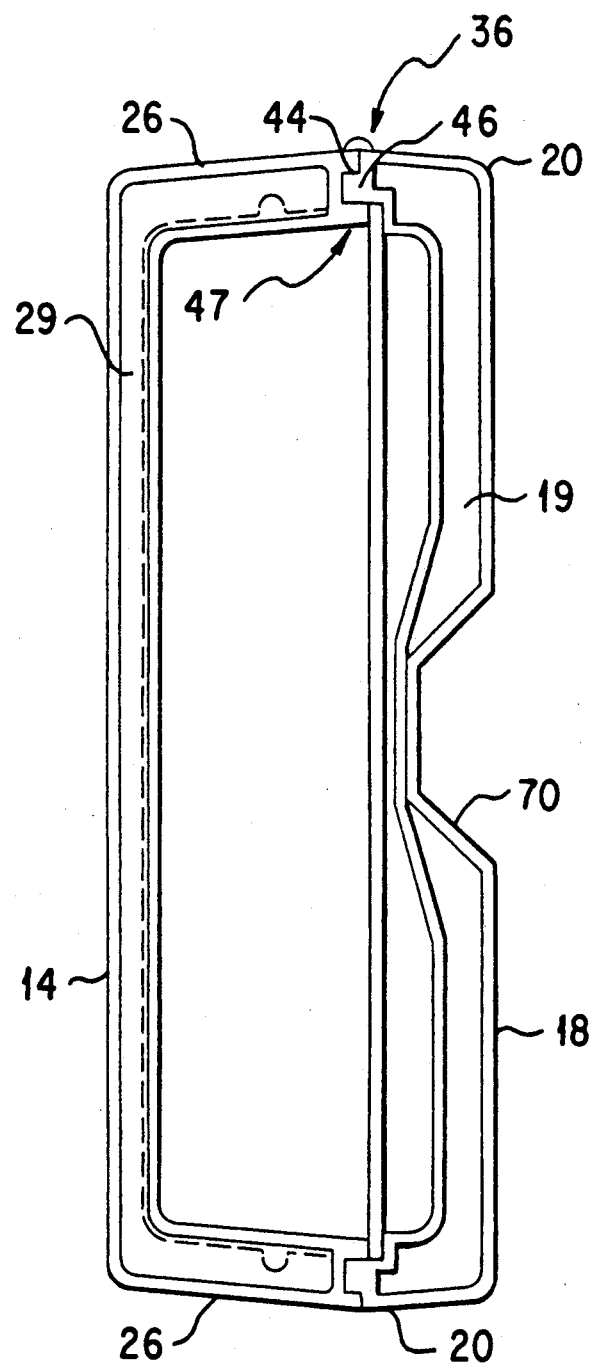
FIG. 3 is an expanded cross-sectional view of the container taken along lines III—III of FIG. 2.

Referring to FIG. 3, first cover 14 also includes a recess 44 which mates with a mounting stop 46 on base 14. Recess 44 and mounting stop 46 are situated along the perimeter of the respective structures to provide a dust seal when the container is closed. First cover 14 also includes a board hold down 47 which helps to keep the ESD sensitive device 62 in place during transportation and shipment The second cover 16 includes a recess 52 similar in construction and purpose to the recess 44 of first cover 14. Recess 52 mates with the mounting stop 46 of base 12.

A shelf 57 (FIG. 2) accommodates a circuit board or other ESD sensitive device placed in the recessed portion of base 12.

In practice, a computer board for which the container of the present invention is appropriately sized, is placed on base 12 and forced past snap-in indents 78 to rest the board on the shelf 57. It will be noted that the shelf not only extends along the perimeter of the base 12, but also includes an intermediary portion which will accommodate the lower surface of a divider panel 58. This divider panel is inserted into a linear recess 60 located on the interior surface of first cover 14, and as the first cover is closed, the divider panel comes into contact with the intermediate portion of shelf 57. With the first cover in a closed position, and the divider panel in place, a first compartment 54 is formed, housing the computer board 62.

When the second cover 16 is closed, either by means of integral hinge and latch, or more preferably by means of locking latches, a second compartment 56 is formed (FIG. 4).

As best seen in FIG. 4, a dust lid 64 forms an integral part of first cover 14. When the second cover 16 is closed, to form second compartment 56, an edge of the second cover communicates with the upper portion of dust lid 64.

Base 12 includes molded stops 68 (see also FIG. 2) to prevent excessive lateral movement of the computer board while in the container.

In use, the container of the present invention will normally be attached to a floor joist or other structural member in a residence or other building. The present invention combines several features to insure that the container will be satisfactorily supported during use. For example, a channel 70 longitudinally situated along a central portion of the bottom 18 of base 12, accommodates the container to a floor beam, joist, pipe, or similar structural member, and reduces the chance of excessive lateral movement of the container.

An extended lip 72 positioned at one end wall 22 of base 12 incorporates a pair of apertures 74 which can accommodate fastening means such as bolts or tie straps for physically fastening the container to a structural member. The opposite end wall of base 12 may also include an extended lip with apertures. In this manner, the container can be further reinforced.

Tie strap bosses 76 may be located in corresponding relationship on second cover 16 and base 12, on the end wall 22 thereof, such that the second cover when closed and in communication with the base will bring the respective tie strap bosses together. This pair may then be connected together by a thin metal strip such as that commonly used for security purposes on various metering devices. These typically have a tamper evident utility and can indicate whether the container has been tampered with.

Figure 5:
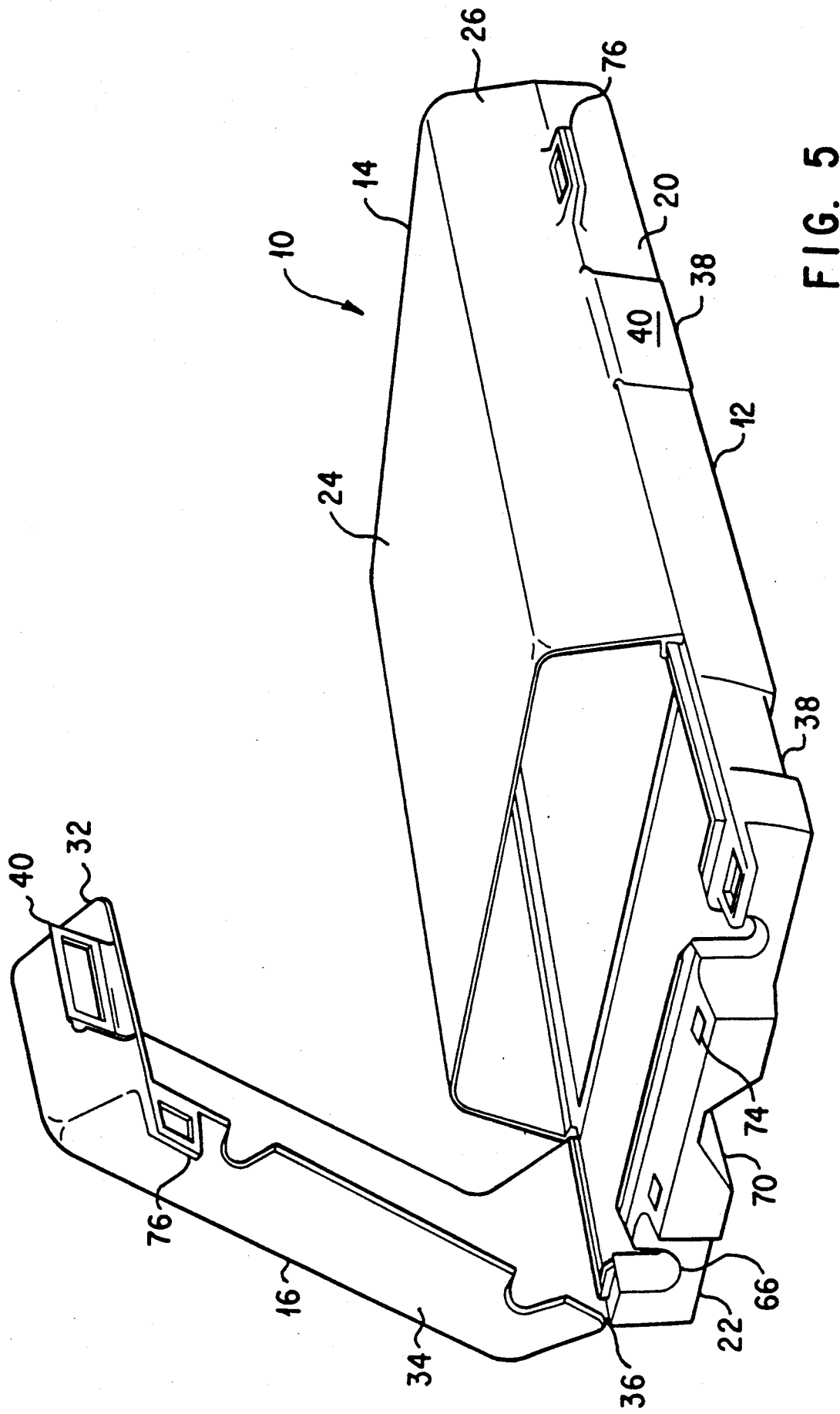
FIG. 5 is an isometric view of an alternate embodiment of the invention.

A pair of tie bosses may optionally be included on the first cover 14 and side wall 20 of base 12, such as shown in FIG. 5, in lieu of or in addition to the pair of tie strap bosses just described, and for the same purpose.

Optionally, a pair of rubberized grommets or gaskets may be designed to fit into recesses 66 in such a way that wiring passing through each of apertures 66 will be flexibly held in place and enclosed about by the grommets (not shown). These grommets provide additional protection to the interior of the container i.e. to both first and second compartments, and also help to hold the input wires in place.

The intermediate portion of the shelf 57 also helps to "buoy" the computer board or other ESD sensitive device to permit the accommodation of for example solder contacts and other irregularities on the under side of the board.

The divider panel is preferably glued in, but could also be snapped into place.

Apertures 74 are preferably molded in the extended lip during the blow molding process, although they could also be drilled. An advantage of molding the apertures is the better assurance of conductivity in the event a conductive material is used. In a coextruded case, drilling holes could open up a non-conductive inner layer and expose it to the outside.

The apertures are preferably countersunk to provide for flush mounted bolts, if used.

In practice, in a preferred embodiment, the computer panel or other ESD sensitive device is placed in the first compartment, snapped into place beneath snap-in indents 78. The first cover is closed to form the first compartment, and the board hold down 47, and mounting stop 46, help to hold the panel in place. The divider panel 58 previously glued or snapped into recess 60 also helps to limit undesirable movement of the computer panel 62.

The container is then brought on site, and mounted to a structural member in a building or other structure. Wiring for telephone and metering systems is then installed, via the recesses 66, into connectors typically mounted at one end of the computer panel 62. During this operation, the first compartment remains essentially undisturbed, being protected by first cover 14, the major part of base 12, and the divider panel 58.

After the hook up is complete, the second cover 16, preferably equipped with the locking latches 50 and locking latch bosses 48 described above, is locked into place.

Thereafter, it is difficult if not impossible to manually open the first cover 14. However, maintenance personnel may utilize a simple screw driver for example to pry open the locking latch to inspect or repair the wired connection as needed.

Because of the design of the dust lid 64, the second cover 16 holds down the first cover 14 at their interface to prevent opening of the first cover.

What is claimed is:

1. A blow molded container suitable for storing a computer panel comprising:
   (a) a base having:
      (i) a bottom,
      (ii) side walls,
      (iii) end walls, and
      (iv) at least one recessed area in one wall to accommodate wiring;
   (b) a cover having:
      (i) a first segment having side walls and end walls, and
      (ii) a second segment having side walls and an end wall; and
   (c) means for latching the base to the second segment at either side of the base and second segment respectively;
   the segment, when closed, forming a first and second compartment respectively; and
   the first compartment not being exposed when the second segment is in the open position and the first segment is in the closed position.

* * * * *

UNITED STATES PATENT AND TRADEMARK OFFICE
CERTIFICATE OF CORRECTION

PATENT NO. : 5,012,926
DATED : May 7, 1991
INVENTOR(S) : David S. Jamison

It is certified that error appears in the above-identified patent and that said Letters Patent is hereby corrected as shown below:

In column 4, line 63, "segment" should read --segments--.

Signed and Sealed this

Twenty-second Day of September, 1992

Attest:

DOUGLAS B. COMER

*Attesting Officer*    *Acting Commissioner of Patents and Trademarks*